(12) United States Patent
Kanazawa et al.

(10) Patent No.: US 7,355,251 B2
(45) Date of Patent: Apr. 8, 2008

(54) LIGHT EMITTING DEVICE

(75) Inventors: Jitsuo Kanazawa, Tokyo (JP); Yo Saito, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/542,197

(22) Filed: Oct. 4, 2006

(65) Prior Publication Data

US 2007/0081288 A1    Apr. 12, 2007

(30) Foreign Application Priority Data

Oct. 11, 2005   (JP) ............................. P2005-295892

(51) Int. Cl.
*H01L 23/62* (2006.01)
*H01L 27/15* (2006.01)
(52) U.S. Cl. ........................................ 257/355; 257/79
(58) Field of Classification Search ................. 257/88, 257/79, 355
See application file for complete search history.

(56) References Cited

U.S. PATENT DOCUMENTS

2005/0184387 A1*   8/2005  Collins et al. .............. 257/712

2006/0056123 A1*   3/2006  Aoyagi et al. ................ 361/56

FOREIGN PATENT DOCUMENTS

JP    A-09-246017    9/1997
JP    A 2001-015815  1/2001

* cited by examiner

*Primary Examiner*—Kiesha L. Rose
(74) *Attorney, Agent, or Firm*—Oliff & Berridge, PLC (57) ABSTRACT

An object is to provide a light emitting device capable of efficiently dissipating heat generated in a semiconductor light-emitting element. The light emitting device 1 for achieving this object is a device wherein a multilayer chip varistor 10 has a varistor element 11 having a varistor layer comprised essentially of ZnO, and a plurality of internal electrodes 101, 102 arranged to sandwich the varistor layer between the internal electrodes; and a plurality of external electrodes 103, 104 formed on an outer surface of the varistor element 11 and each connected to a corresponding internal electrode 101, 102; wherein a semiconductor light-emitting element 20 has an electroconductive substrate 202 of ZnO, and semiconductor layers 201, 203, 205 of ZnO formed by epitaxial growth on two surfaces of the electroconductive substrate 202; wherein the semiconductor light-emitting element 20 is placed on a principal surface 11*a* intersecting with the internal electrodes 101, 102 of the multilayer chip varistor 10; wherein the semiconductor layer 205 is fixed in face contact to the principal surface 11*a*.

8 Claims, 7 Drawing Sheets

LIGHT EMITTING DEVICE

BACKGROUND OF THE INVENTION

1. Field of the Invention

The present invention relates to a light emitting device.

2. Related Background Art

A known light emitting device of this type is one having a semiconductor light-emitting element, and a varistor connected in parallel to this semiconductor light-emitting element (e.g., Japanese Patent Application Laid-Open No. 2001-15815). In the light emitting device described in Patent Document 1, the semiconductor light-emitting element is protected from an ESD (Electrostatic Discharge) surge by the varistor connected in parallel thereto.

SUMMARY OF THE INVENTION

Incidentally, the semiconductor light-emitting element generates heat during its light-emitting operation. As the temperature of the semiconductor light-emitting element becomes higher, the light-emitting operation is affected thereby. For this reason, it is necessary to efficiently dissipate the heat generated. Particularly, in a case where the semiconductor light-emitting element is sealed in an optically transparent resin, it becomes difficult to dissipate the heat generated in the semiconductor light-emitting element.

An object of the present invention is to provide a light emitting device capable of efficiently dissipating heat generated in a semiconductor light-emitting element.

A light emitting device according to the present invention is a light emitting device comprising a semiconductor light-emitting element and a multilayer chip varistor, wherein the multilayer chip varistor comprises: a laminate having a varistor layer comprised essentially of ZnO, and a plurality of internal electrodes arranged to sandwich the varistor layer between the internal electrodes; and a plurality of external electrodes formed on an outer surface of the laminate and each connected to a corresponding internal electrode out of the plurality of internal electrodes; wherein the semiconductor light-emitting element comprises: an electroconductive substrate of ZnO or GaN; and a pair of semiconductor layers of ZnO or GaN formed by epitaxial growth on two surfaces of the electroconductive substrate; wherein the semiconductor light-emitting element is placed on an outer surface intersecting with the internal electrodes of the multilayer chip varistor, and wherein one of the pair of semiconductor layers is fixed in face contact to the mentioned outer surface.

According to the present invention, the multilayer chip varistor is connected in parallel to the semiconductor light-emitting element, whereby the semiconductor light-emitting element can be protected from the ESD surge. In addition, since in the present invention the multilayer chip varistor has the external electrodes connected to the semiconductor light-emitting element and the internal electrodes connected to the external electrodes, the heat generated in the semiconductor light-emitting element is transferred mainly to the external electrodes and the internal electrodes to be dissipated. The configuration of the present invention expands heat-radiation paths of the heat generated in the semiconductor light-emitting element and is thus able to efficiently dissipate the heat generated in the semiconductor light-emitting element Furthermore, the semiconductor layer is fixed in face contact to the outer surface of the multilayer chip varistor, whereby the p-type semiconductor layer or n-type semiconductor layer is thermally, electrically, and mechanically connected to the outer surface, so as to achieve more effective transmission of heat Incidentally, the varistor layer is comprised essentially of ZnO. ZnO has the thermal conductivity equivalent to that of alumina or the like normally used as a heat-radiating substrate and thus has the relatively good thermal conductivity. Therefore, it is feasible to prevent the varistor layer from inhibiting dissipation of heat from the internal electrodes.

The present invention as described above successfully provides the light emitting device capable of efficiently dissipating the heat generated in the semiconductor light-emitting element.

DESCRIPTION OF THE PREFERRED EMBODIMENTS

The expertise of the present invention can be readily understood in view of the following detailed description with reference to the accompanying drawings presented by way of illustration only. Subsequently, an embodiment of the present invention will be described with reference to the accompanying drawings. The same portions will be denoted by the same reference symbols as much as possible, without redundant description.

Figure 1:
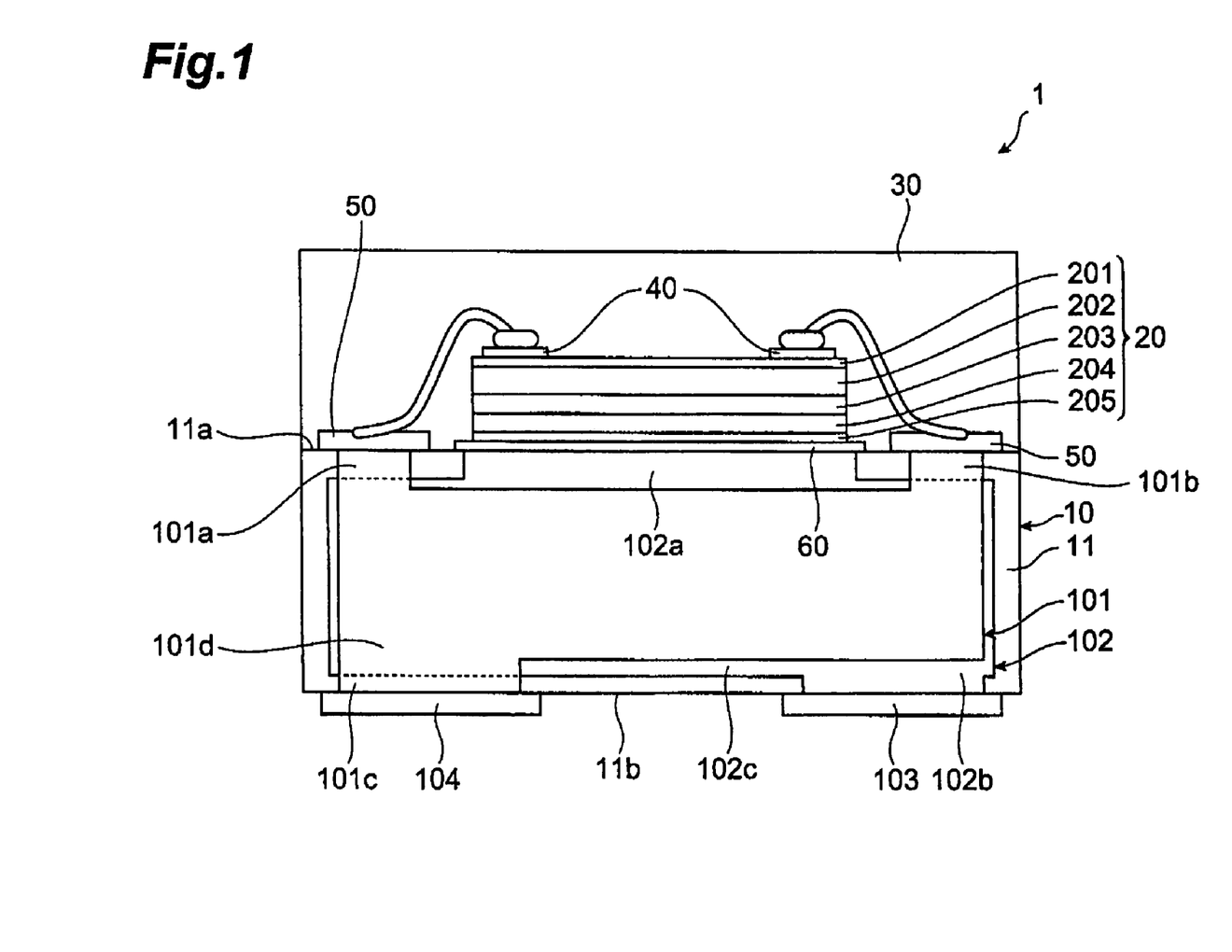
FIG. 1 is a drawing showing a sectional configuration of a light emitting device according to an embodiment of the present invention
Figure 2:
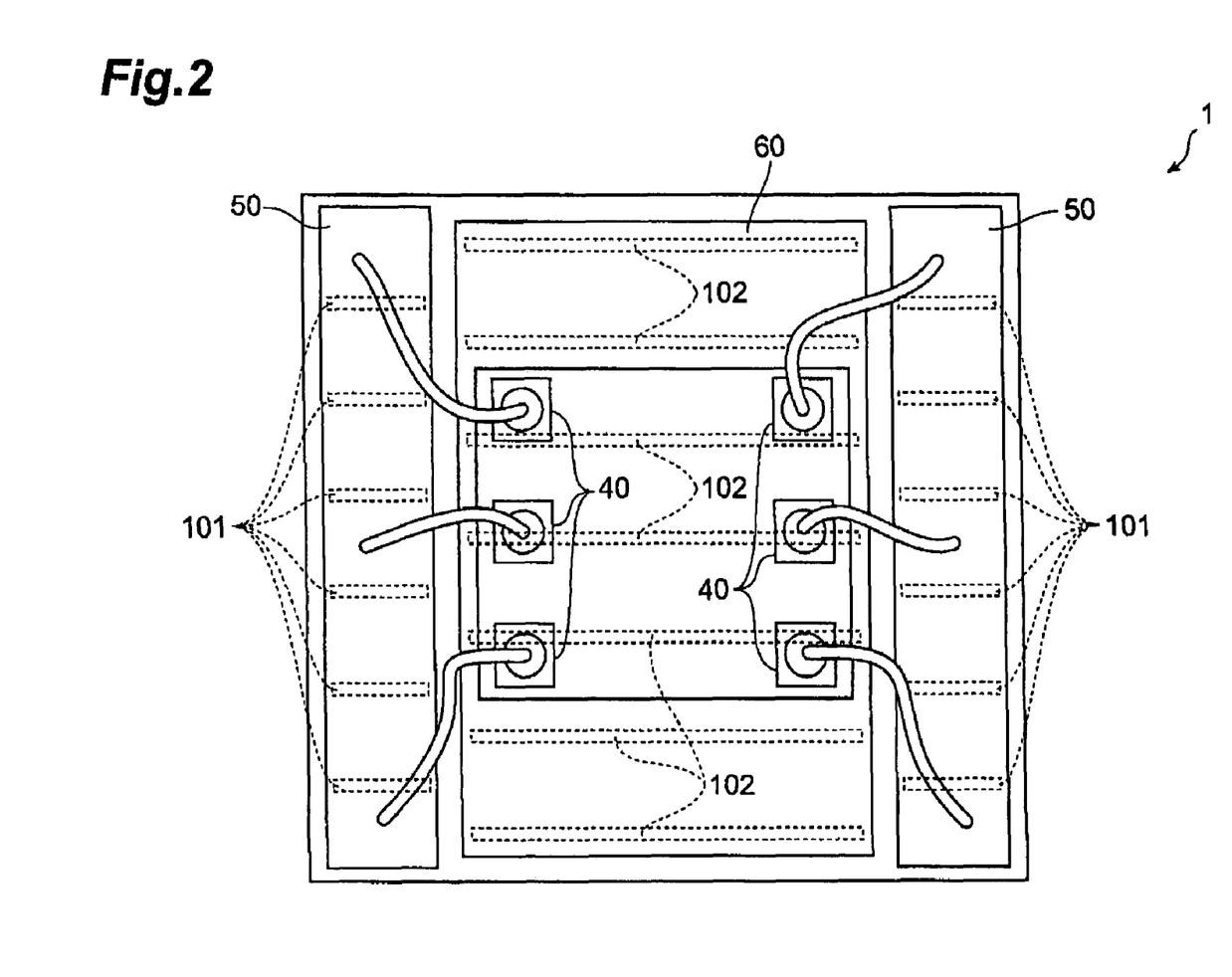
FIG. 2 is a schematic top view of the light emitting device according to the embodiment of the present invention.
Figure 3:
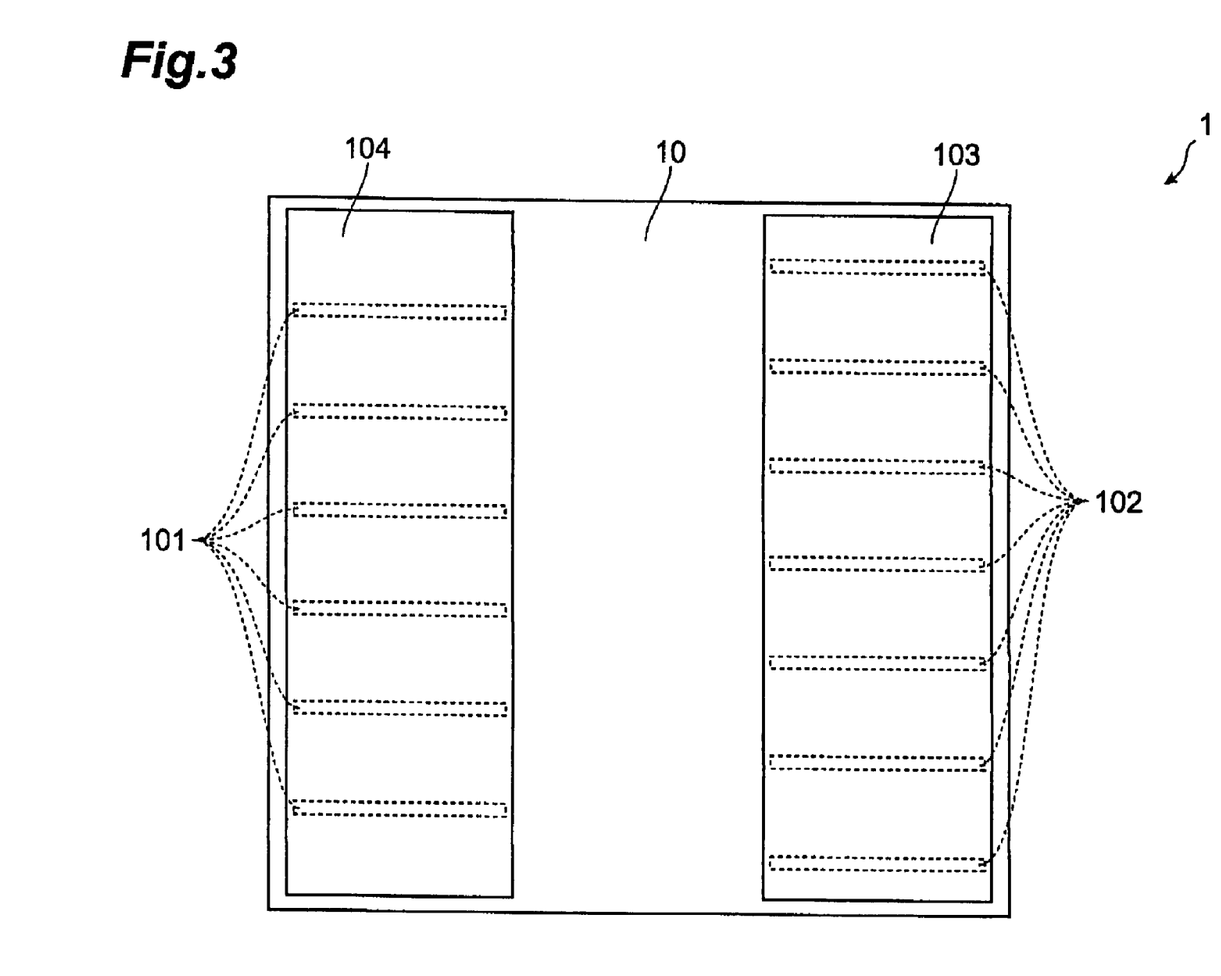
FIG. 3 is a schematic bottom view of the light emitting device according to the embodiment of the present invention.

A configuration of a light emitting device 1 according to the embodiment of the present invention will be described with reference to FIGS. 1 to 3. FIG. 1 is a drawing for explaining a sectional configuration of the light emitting device 1 according to the present embodiment, and shows a cross section near the center of the light emitting device 1. FIG. 2 is a schematic top view of the light emitting device 1. FIG. 3 is a schematic bottom view of the light emitting device 1.

The light emitting device 1, as shown in FIGS. 1 to 3, is provided with a semiconductor light-emitting element 20 and a multilayer chip varistor 10. The semiconductor light-emitting element 20 is laid on the multilayer chip varistor 10. The semiconductor light-emitting element 20 is covered by a silicone layer 30 containing fine particles of a phosphor.

First, a configuration of the multilayer chip varistor 10 will be described The multilayer chip varistor 10 has a varistor element 11 of approximately a rectangular parallelepiped shape, a plurality (a pair in the present embodiment) of external electrodes 50, and a plurality (a pair in the present embodiment) of external electrodes 103, 104.

The pair of external electrodes 50 are formed each on one principal surface (outer surface) 11a of the varistor element 11. The pair of external electrodes 103, 104 are formed each on the other principal surface (outer surface) 11*b* of the varistor element 11. The varistor element 11 is set, for example, to the length of about 0.5 to 2.0 mm, the width of about 0.5 to 2.0 mm, and the thickness of about 0.3 mm. The external electrode 103 functions as an input terminal electrode of the multilayer chip varistor 10, while the external electrode 104 functions as an output terminal electrode of the multilayer chip varistor 10. The external electrodes 50 function as pad electrodes electrically connected to the semiconductor light-emitting element 20 described later.

The varistor element 11 is constructed as a laminate in which a plurality of varistor layers to exhibit the current-voltage nonlinear characteristic (hereinafter referred to as "varistor characteristic"), and a plurality of first internal electrodes 101 and second internal electrodes 102 are stacked. The first internal electrodes 101 and the second internal electrodes 102 are a plurality of layers alternately arranged along a stack direction of the varistor layers (which will be referred to hereinafter simply as "stack direction") in the varistor element 11.

The first internal electrodes 101 and the second internal electrodes 102 are arranged so that at least one varistor layer is sandwiched between the first and second internal electrodes. The pair of principal surfaces 11*a*, 11*b* of the varistor element 11 extend in a direction parallel to the stack direction of the varistor layers. The first internal electrodes 101 and the second internal electrodes 102 are juxtaposed along the stack direction of the varistor layers. In practical multilayer chip varistor 10, the plurality of varistor layers are integrally formed so that no boundary can be visually recognized between the layers.

The varistor layers are made of an element material containing ZnO (zinc oxide) as a principal component and containing Co, a rare-earth metal element, or Bi as an accessory component Furthermore, the varistor layers contain single metals such as a IIIb element (B, Al, Ga, In), Si, Cr, Mo, an alkali metal element (K, Rb, Cs), and an alkaline-earth metal element (Mg, Ca, Sr, Ba), or oxides of these. In the present embodiment the varistor layers contain Pr, Co, Cr, Ca, Si, K, Al, etc. as accessory components.

In the present embodiment Pr is used as a rare-earth metal. Pr is a material for the varistor layers to exhibit the varistor characteristic. The reason for use of Pr is that Pr demonstrates excellent current-voltage nonlinearity and little characteristic variation in mass production. There are no particular restrictions on the content of ZnO in the varistor layers, but it is normally 99.8 to 69.0% by mass, where the total content of all the materials forming the varistor layers is 100% by mass. The thickness of the varistor layers is, for example, approximately 5-60 µm.

Each first internal electrode 101 includes a first electrode portion 101*a*, a second electrode portion 101*b*, a third electrode portion 101*c*, and a fourth electrode portion 101*d*. The fourth electrode portion 101*d* overlaps with a third electrode portion 102*c* of a second internal electrode 102 described later, when viewed from the stack direction. The fourth electrode portion 101*d* is of approximately rectangular shape.

The third electrode portion 101*c* is drawn out from the fourth electrode portion 101*d* so as to be exposed in one principal surface 11*b*, and functions as a lead conductor. The third electrode portion 101*c* is physically and electrically connected to the external electrode 104.

The first electrode portion 101*a* and second electrode portion 101*b* are drawn out from the fourth electrode portion 101*d* so as to be exposed in the other principal surface 11*a*, and function as lead conductors. The first electrode portion 101*a* and the second electrode portion 101*b* are physically and electrically connected to the pair of external electrodes 50, respectively.

The fourth electrode portion 101*d* is electrically connected through the third electrode portion 101*c* to the external electrode 104 and is also electrically connected through the first electrode portion 101*a* and the second electrode portion 101*b* to the pair of external electrodes 50. The first electrode portion 101*a*, second electrode portion 101*b*, and third electrode portion 101*c* are formed integrally with the fourth electrode portion 101*d*.

Each second internal electrode 102 includes a first electrode portion 102*a*, a second electrode portion 102*b*, and a third electrode portion 102*c*. The third electrode portion 102*c* overlaps with the fourth electrode portion 101*d* of the first internal electrode 101, when viewed from the stack direction. The third electrode portion 102*c* is of approximately rectangular shape.

The second electrode portion 102*b* is drawn out from the third electrode portion 102*c* so as to be exposed in one principal surface 11*b*, and functions as a lead conductor. The second electrode portion 102*b* is physically and electrically connected to the external electrode 103.

The first electrode portion 102*a* is drawn out from the third electrode portion 102*c* so as to be exposed in the other principal surface 11*a*, and functions as a lead conductor. The first electrode portion 102*a* is physically and electrically connected through an external electrode 60 to the semiconductor light-emitting element 20. It is also preferable to interpose an Au-Sn solder layer between the semiconductor light-emitting element 20 and the external electrode 60. Each third electrode portion 102*c* is electrically connected through the second electrode portion 102*b* to the external electrode 103 and is also electrically connected through the first electrode portion 102*a* to the semiconductor light-emitting element 20. The first electrode portion 102*a* and second electrode portion 102*b* are formed integrally with the third electrode portion 102*c*.

The first and second internal electrodes 101, 102 contain an electroconductive material. There are no particular restrictions on the electroconductive material in the first and second internal electrodes 101, 102, but it is preferably a material consisting of Pd or Ag—Pd alloy or Ag. The thickness of the first and second internal electrodes 101, 102 is, for example, approximately 0.5-5 µm.

The external electrode 103 and the external electrode 104 are arranged with a predetermined spacing in a direction perpendicular to the stack direction of the varistor layers and parallel to the other principal surface 11*a*, on one principal surface 11*b*. The external electrodes 103, 104 are of rectangular shape.

The pair of external electrodes 50 are arranged with a predetermined spacing in a direction perpendicular to the stack direction of the varistor layers and parallel to the one principal surface 11*b*, on the other principal surface 11*a*. The external electrodes 50 are of rectangular shape, and are formed so as to be electrically connected to the first electrode portion 101*a* and the second electrode portion 101*b* of each internal electrode 101.

The fourth electrode portion 101*d* of the first internal electrode 101 overlaps with the third electrode portion 102*c* of the second internal electrode 102, between the fourth electrode portions 101*d* of first internal electrodes 101 adjacent to each other. Therefore, a region in a varistor layer overlapping with the fourth electrode portion 101*d* and the third electrode portion 102*c* functions as a region to exhibit the varistor characteristic. In the multilayer chip varistor 10 having the above-described configuration, one varistor part is constructed of the fourth electrode portions 101d, the third electrode portions 102c, and the regions in the varistor layers overlapping with the fourth electrode portions 101d and the third electrode portions 102c.

Subsequently, a configuration of the semiconductor light-emitting element 20 will be described. The semiconductor light-emitting element 20 is a Light-Emitting Diode (LED) of a ZnO semiconductor. The semiconductor light-emitting element 20 is of approximately a rectangular parallelepiped shape, and has an n-ZnO transparent electrode layer 201, an n-ZnO substrate 202, an n-ZnO layer 203, a luminous layer 204, and a p-ZnO layer 205 in the order named. Although the present embodiment uses the light-emitting diode of the ZnO semiconductor, it is also possible to use a light-emitting diode of a GaN semiconductor. In that case, the substrate is also a GaN substrate. Since GaN and ZnO have the respective lattice constants and coefficients of thermal expansion close to each other, it is also possible, for example, to adopt a configuration wherein a GaN semiconductor layer is formed on a ZnO substrate.

The semiconductor light-emitting element 20 is an element wherein the n-ZnO transparent electrode layer 201 being an n-type semiconductor region is formed on one principal surface of the n-ZnO substrate 202 by epitaxial growth and wherein the n-ZnO layer 203 of an n-type semiconductor region, the luminous layer 204, and the p-ZnO layer 205 of a p-type semiconductor region are formed on the other principal surface of the n-ZnO substrate 202 by epitaxial growth. The n-ZnO substrate 202 is an electrically conductive, transparent substrate.

The luminous layer 204 is formed on the n-ZnO layer 203 of the n-type semiconductor region and generates light in a luminous region through recombination of carriers (electrons and holes) supplied from the n-ZnO layer 203 and from the p-ZnO layer 205. The luminous layer 204 can be, for example, of the SQW structure of ZnO. The luminous region is made in a region into which the carriers are injected, in the luminous layer 204.

In the semiconductor light-emitting element 20 the p-ZnO layer 205 is fixed onto the principal surface 11a of the multilayer chip varistor 10 by the external electrode 60 of an Au-Sn solder. Pad electrodes 40 are formed at six positions on the n-ZnO transparent electrode layer 201 of the semiconductor light-emitting element 20. Each pad electrode 40 is electrically connected to the external electrode 50 of the multilayer chip varistor 10 by wire bonding. Therefore, a voltage can be applied between the p-ZnO layer 205 of the p-type semiconductor region and the n-ZnO layer 203 of the n-type semiconductor region, whereby the semiconductor light-emitting element 20 emits light according to the voltage applied.

Figure 4:
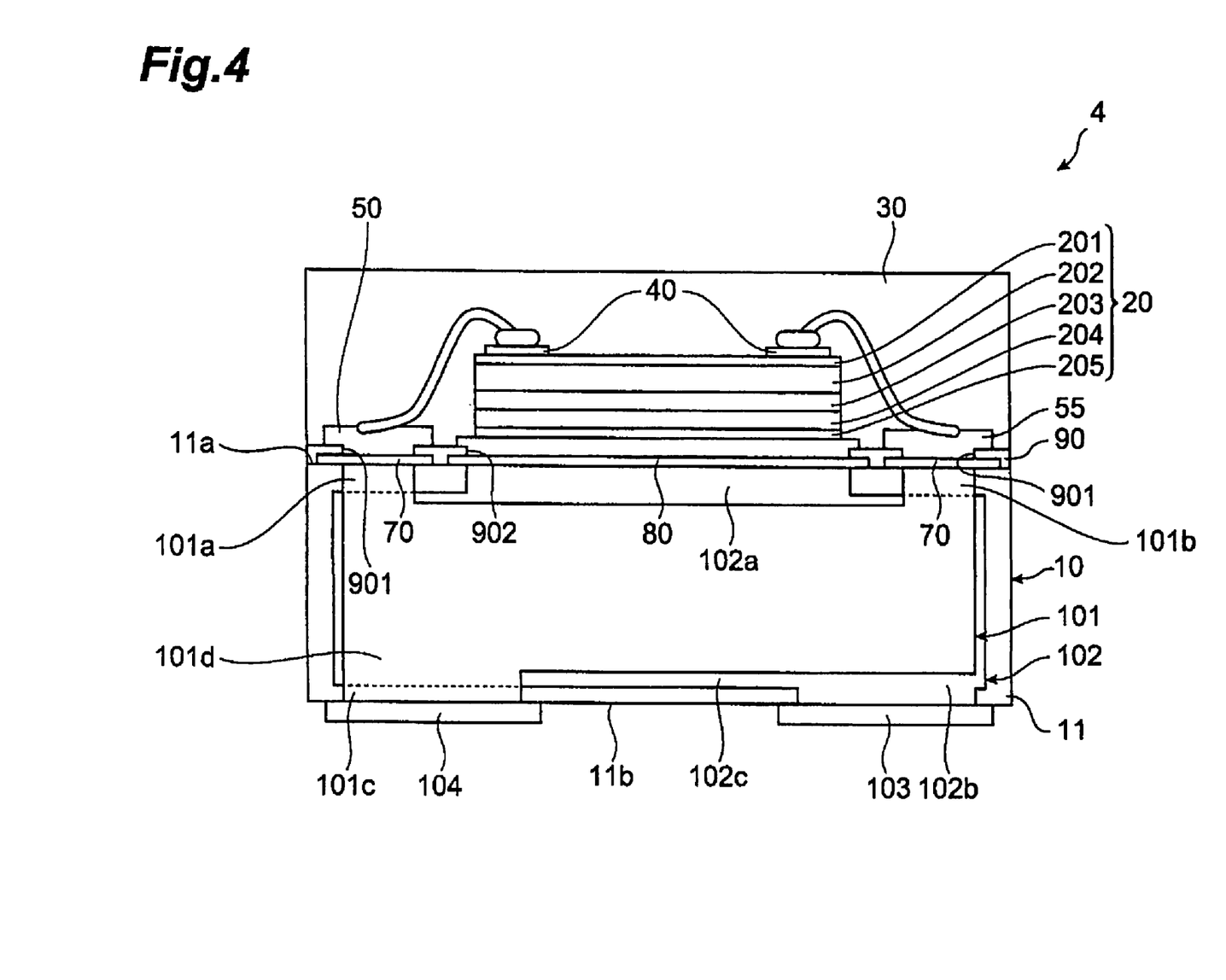
FIG. 4 is a drawing showing a sectional configuration of a light emitting device as a modification example.
Figure 5:
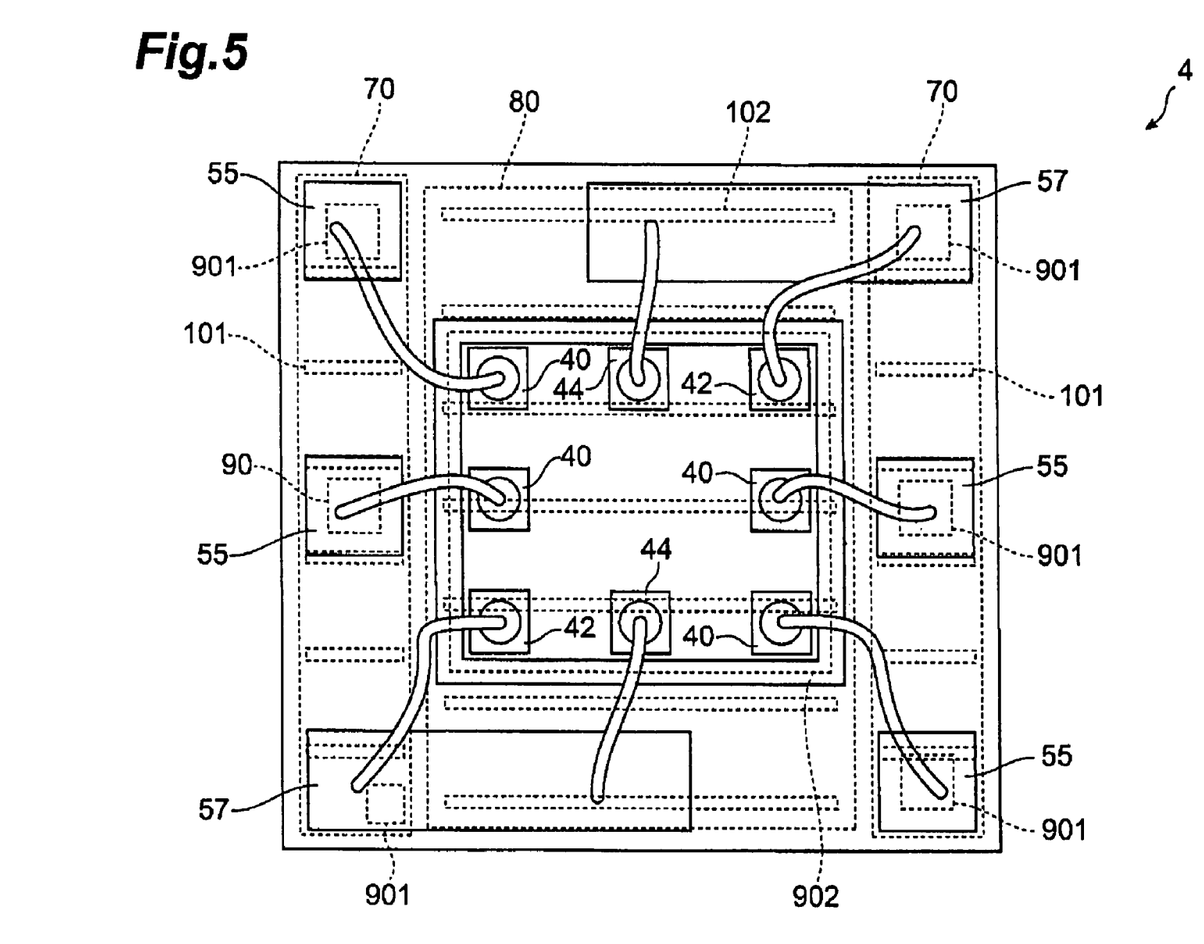
FIG. 5 is a schematic top view of the light emitting device as the modification example.

A modification example of the present embodiment will be described with reference to FIGS. 4 and 5. FIG. 4 is a drawing showing a sectional configuration of a light emitting device 4 as the modification example of the present embodiment FIG. 5 is a schematic top view of the light emitting device 4. The light emitting device 4 is provided with a multilayer chip varistor 10 and a semiconductor light-emitting element 20, the configurations of which are the same as those described above and the description of which is thus omitted herein.

A conductor layer 80 and conductor layers 70 are formed each on the principal surface 11a of the multilayer chip varistor 10 in the light emitting device 4. The conductor layer 80 is of much the same shape as the external electrode 60 in the light emitting device 1. Therefore, the conductor layer 80 is electrically connected to each second internal electrode 102 of the multilayer chip varistor 10. The conductor layers 70 are of much the same shape as the external electrodes 50 in the light emitting device 1. Therefore, the conductor layers 70 are electrically connected to each first internal electrode 101 of the multilayer chip varistor 10.

An insulating layer 90 is formed so as to cover the conductor layers 70 and conductor layer 80. Contact holes 901 and a contact hole 902 are formed at predetermined positions in the insulating layer 90. The contact holes 901 are formed at the four corners of the principal surface 11a of the multilayer chip varistor 10 and approximately in the central regions of a pair of edges facing each other. The contact hole 902 is formed approximately in the central region of the principal surface 11a (the portion where the semiconductor light-emitting element 20 is mounted) and in a shape approximately equal to the contour of the semiconductor light-emitting element 20.

Pad electrodes 55 and pad electrodes 57 are formed at the positions corresponding to the contact holes 901. Since the insulating layer 90 is formed as described above, the shapes and positions of the pad electrodes 55 and pad electrodes 57 can be arbitrarily set. The shapes of the pad electrodes 55 and pad electrodes 57 shown in FIG. 5 are just an example, and they can also be integrally provided so as to extend along the outer periphery of the principal surface 11a, for example.

Figure 6:
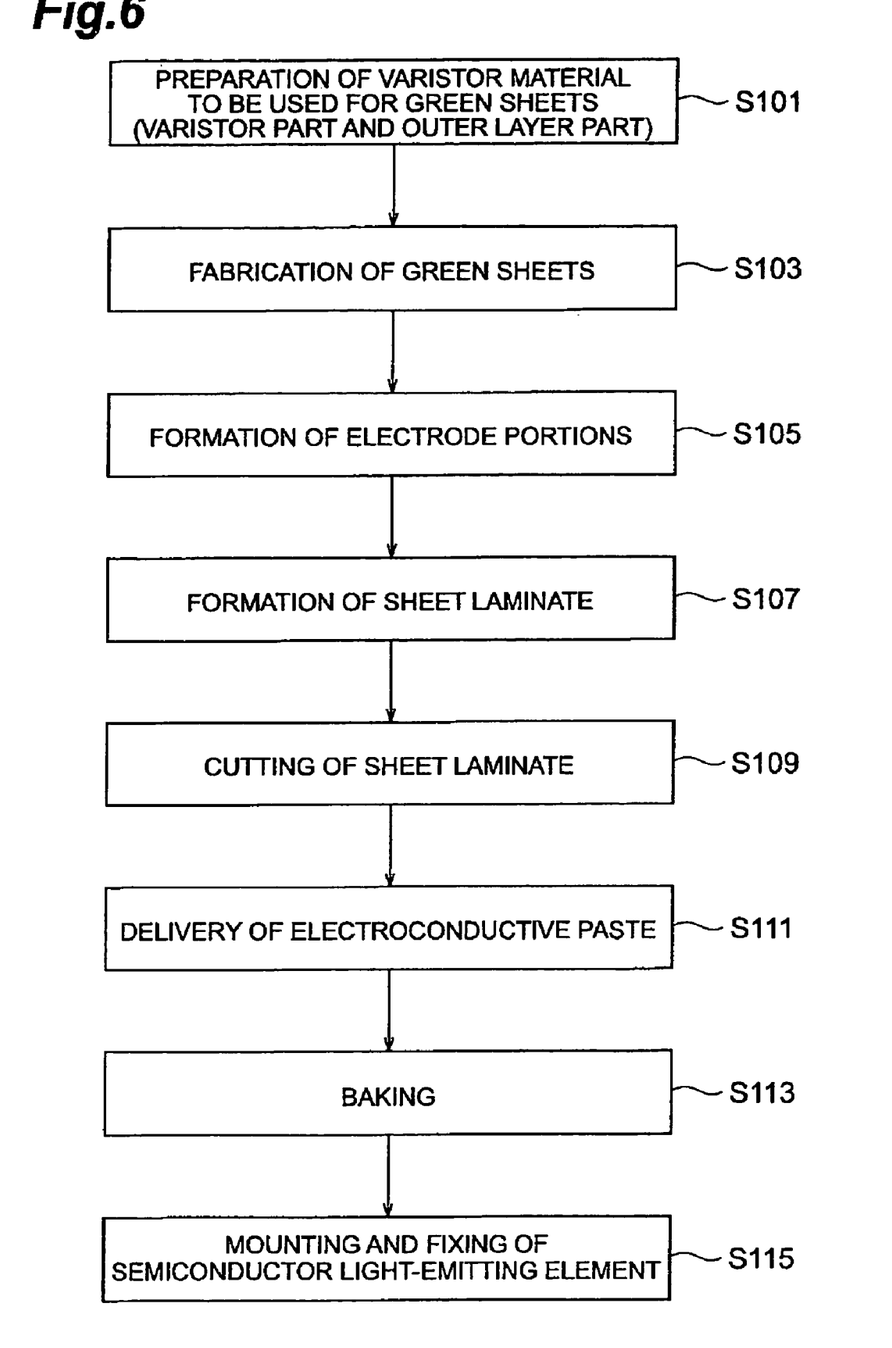
FIG. 6 is a flowchart for explaining a production process of the light emitting device as the embodiment of the present invention.
Figure 7:
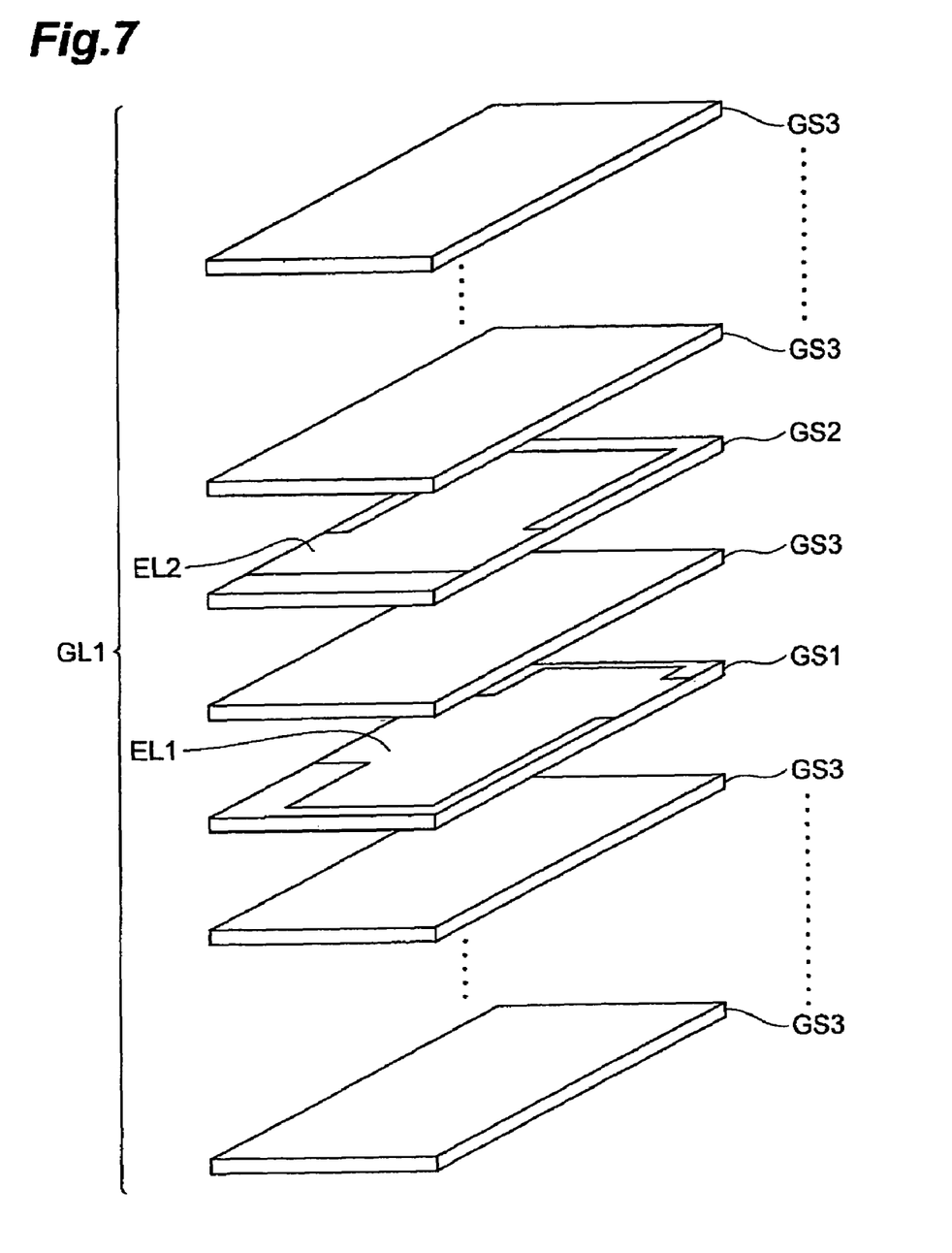
FIG. 7 is a drawing for explaining the production process of the light emitting device as the embodiment of the present invention

An external electrode 80 is formed at the position corresponding to the contact hole 902. The semiconductor light-emitting element 20 is mounted and fixed on this external electrode 80. Electrodes 40, electrodes 42, and electrodes 44 are formed each on the semiconductor light-emitting element 20. Each electrode 40 is connected to a pad electrode 55, and each of the electrodes 42 and 44 is connected to a pad electrode 57. The positions of these electrodes 40, 42, 44 are also arbitrary, and the connections thereof to the pad electrodes can also be arbitrarily set Subsequently, a production process of the light emitting device 1 having the above-described configuration will be described with reference to FIGS. 6 and 7. FIG. 6 is a flowchart for explaining a production process of the multilayer chip varistor according to the present embodiment. FIG. 7 is a drawing for explaining the production process of the multilayer chip varistor according to the present embodiment The first step is to weigh each of ZnO as a principal component and trace additives such as metals or oxides of Pr, Co, Cr, Ca, Si, K, and Al for the varistor layers, at a predetermined ratio and thereafter mix them to prepare a varistor material (step S101). After that, an organic binder, an organic solvent, an organic plasticizer, etc. are added into this varistor material and they are mixed and pulverized for about 20 hours with a ball mill or the like to obtain a slurry.

This slurry is applied onto a film, for example, of a polyethylene terephthalate by a known method such as the doctor blade method, and thereafter dried to form membranes in the thickness of about 30 μm. The membranes obtained in this manner are stripped off from the film to obtain green sheets (step S103).

Next, a plurality of electrode portions corresponding to the first and second internal electrodes 101, 102 (in the number corresponding to the number of divided chips described later) are formed on the green sheets (step S105). The electrode portions corresponding to the first and second internal electrodes 101, 102 are formed by printing an electroconductive paste as a mixture of a metal powder consisting primarily of Pd particles, an organic binder, and an organic solvent, by a printing method such as screen printing, and drying it.

The next step is to stack the green sheets with the electrode portions and green sheets without the electrode portions in the predetermined order to form a sheet laminate (step S107). The sheet laminate obtained in this manner is cut in chip units to obtain a plurality of divided green bodies GL1 (cf. FIG. 7) (step S109).

In the resultant green body GL1, the green sheets successively stacked include the green sheets GS1 on each of which an electrode portion EL1 corresponding to the first internal electrode 101 is formed, the green sheets GS2 on each of which an electrode portion EL2 corresponding to the second internal electrode 102 is formed, and the green sheets GS3 without the electrode portions EL1, EL2. The green sheet GS3 located between a green sheet GS1 and a green sheet GS2 may consist of a plurality of sheets, or may be excluded.

The next step is to deliver an electroconductive paste for the external electrodes 103, 104, 50 onto outer surfaces of the green body GL1 (step S111). At this step the electrode portions are formed by printing the electroconductive paste so as to contact the corresponding electrode portions EL1, EL2 on one principal surface of the green body GL1 by the screen printing technique and thereafter drying it.

The next step is to subject the green body GL1 with the electroconductive paste to a thermal treatment at 180-400° C. and for about 0.5-24 hours to effect debindering and thereafter perform baking at 1000-1400° C. and for about 0.5-8 hours (step S113). This baking turns the green sheets GS1-S3 in the green body GL1, into varistor layers. Each electrode portion EL1 turns into the second internal electrode 102. Each electrode portion EL2 turns into the first internal electrode 101.

The above process results in obtaining the multilayer chip varistor 10. After the baking, an alkali metal (e.g., Li, Na, or the like) may be diffused from the surface of the varistor element 11.

After that, the semiconductor light-emitting element 20 prepared in advance is mounted and fixed on the multilayer chip varistor 10 and is covered by the silicone layer 30 to obtain the light emitting device 1 (step S115).

In the present embodiment, as described above, the multilayer chip varistor 10 is connected in parallel to the semiconductor light-emitting element 20, whereby the semiconductor light-emitting element 20 can be protected from the ESD surge.

Since in the present embodiment the multilayer chip varistor 10 has the external electrodes 50 and external electrode 60 connected to the semiconductor light-emitting element 20 and the internal electrodes 101, 102 connected to the external electrodes 50 and to the external electrode 60, the heat generated in the semiconductor light-emitting element 20 is transferred mainly to the internal electrodes 101, 102 to be dissipated. The present embodiment expands the heat-radiation paths of the heat generated in the semiconductor light-emitting element 20, and is thus able to efficiently dissipate the heat generated in the semiconductor light-emitting element 20.

In the present embodiment the varistor layers contain ZnO as a principal component ZnO has the thermal conductivity equivalent to that of alumina or the like normally used as a heat-radiating substrate, and thus has the relatively good thermal conductivity. Therefore, it is feasible to prevent the varistor layers from inhibiting dissipation of the heat from the internal electrodes 101, 102.

Incidentally, in the multilayer chip varistor 10 of the present embodiment the external electrode 103 functioning as an input terminal electrode and the external electrode 104 functioning as an output terminal electrode are placed both on one principal surface 11b of the varistor element 11. This multilayer chip varistor 10 is mounted on an external substrate, an external device, or the like by electrically and mechanically connecting each of the external electrodes 103, 104 to a land corresponding to the external electrode 103, 104, using a solder ball, a bump electrode, or the like.

In the present embodiment, preferably, the green body GL1 contains Pr, and the electroconductive paste for the external electrodes 60, 80, 103, 104 contains one of Pd, Au, Ag, Pt, Al, and Ni. Since the green body GL1 with the electroconductive paste is baked to obtain the varistor element 11 and the electrode layers for the external electrodes 103, 104, the varistor element 11 and the electrode layers are simultaneously baked. This can enhance the adhesive strength between the varistor element 11 and the external electrodes 103, 104. The electroconductive paste may further contain glass for improvement in the adhesive strength.

When the multilayer chip varistor is constructed in the form of a BGA package, the area of the external electrodes functioning as the input/output terminal electrodes or ground terminal electrode is particularly small. For this reason, the adhesive strength becomes lower between the varistor element and the external electrodes, so that the external electrodes could be delaminated from the varistor element. However, the multilayer chip varistor 10 of the present embodiment is improved in the adhesive strength between the varistor element 11 and the external electrodes 103, 104 as described above, whereby the external electrodes 103, 104 are prevented from being delaminated from the varistor element 11.

In the present embodiment, the pair of external electrodes 103, 104 are formed on one principal surface 11b of the varistor element 11, and the pair of external electrodes 50 are formed on the other principal surface 11a facing the one principal surface 11b. The first and second internal electrodes 101, 102 include the fourth electrode portions 101d and third electrode portions 102c overlapping with each other, and the first electrode portions 101a, second electrode portions 101b, third electrode portions 101c, first electrode portions 102a, and second electrode portions 102b drawn out from the fourth electrode portion 101d and from the third electrode portion 102c so as to be exposed in the one principal surface 11b and in the other principal surface 11a. The plurality of external electrodes 103, 104, 50, and the external electrode 60 are electrically connected to the corresponding internal electrodes 101, 102 through the first electrode portion 101a, second electrode portion 101b, third electrode portion 101c, first electrode portion 102a, or second electrode portion 102b. In this case, the semiconductor light-emitting element 20 is connected to the external electrodes 50 and external electrode 60, whereby it is mounted on the multilayer chip varistor 10. Therefore, it is easy and simple to implement mounting for electrically and physically connecting the semiconductor light-emitting element 20 to the external electrodes 50 and the external electrode 60. The multilayer chip varistor 10 is mounted on an external substrate, an external device, or the like in a state in which the one principal surface 11b with the external electrodes 103, 104 faces the external substrate, external device, or the like. Therefore, it is also easy and simple to implement mounting of the multilayer chip varistor 10.

In the present embodiment the semiconductor light-emitting element can be connected to the plurality of external electrodes 50, 55 by wire bonding with a plurality of wires, whereby the heat generated in the semiconductor light-emitting element 20 can be more efficiently dissipated through the wires. The electroconductive paste for the external electrodes 50, 55 contains one of Au, Pd, and Ag. Preferably, it contains Au in order to facilitate the wire bonding. In addition, it may further contain glass in order to improve the adhesive strength.

What is claimed is:

1. A light emitting device comprising a semiconductor light-emitting element and a multilayer chip varistor,
   the multilayer chip varistor comprising:
   a laminate having a varistor layer comprised essentially of ZnO, and a plurality of internal electrodes arranged to sandwich the varistor layer between the internal electrodes; and
   a plurality of external electrodes formed on an outer surface of the laminate; wherein each external electode of the plurality of external electrodes is connected to a corresponding internal electrode of the plurality of internal electrodes;
   the semiconductor light-emitting element comprising:
   an electroconductive substrate of ZnO or GaN; and a pair of semiconductor layers of ZnO or GaN formed by epitaxial growth on two surfaces of the electroconductive substrate;
   wherein the semiconductor light-emitting element is disposed on an outer surface of the multilayer chip varistor parallel to a stacking direction of the internal electrodes of the multilayer chip varistor, and wherein one of the pair of semiconductor layers is fixed in face contact to the outer surface of the multilayer chip varistor.

2. The light emitting device according to claim 1, wherein an insulating layer covering the external electrodes and having contact holes is formed on the outer surface of the laminate.

3. A light emitting device comprising a semiconductor light-emitting element and a multilayer chip varistor,
   the multilayer chip varistor comprising a laminate having a varistor layer and a plurality of internal electrodes arranged to sandwich the varistor layer between the internal electrodes,
   wherein the semiconductor light emitting element is disposed on an outer surface of the multilayer chip varistor that is parallel to a stacking direction of the internal electrodes while being in face contact with the multilayer chip varistor.

4. The light emitting device according to claim 3,
   wherein the multilayer chip varistor further comprises a plurality of external electrodes disposed on an outer surface of the laminate and connected to corresponding internal electrodes of the plurality of internal electrodes.

5. The light emitting device according to claim 4,
   wherein the semiconductor light-emitting element has a luminous layer and a pair of semiconductor layers arranged to sandwich the luminous layer between the semiconductor layers, and
   the semiconductor light-emitting element is fixed to at least one of the external electrodes while one of the pair of semiconductor layers contacts the one of the external electrodes.

6. The light emitting device according to claim 3,
   the multilayer chip varistor further comprising:
   a plurality of conductor layers disposed on the outer surface of the laminate and connected to corresponding internal electrodes of the plurality of internal electrodes;
   an insulating layer formed on the outer surface of the laminate, covering the conductor layers and having a plurality of contact holes; and
   a plurality of external electrodes disposed on the insulating layer and connected to corresponding conductor layers of the plurality of conductor layers via corresponding contact holes of the plurality of contact holes.

7. The light emitting device according to claim 6,
   wherein the semiconductor light-emitting element has a luminous layer and a pair of semiconductor layers arranged to sandwich the luminous layer between the semiconductor layers, and
   wherein the semiconductor light-emitting element is fixed to at least one of the external electrodes while one of the pair of semiconductor layers contacts the one of the external electrodes.

8. The light emitting device according to claim 3, the varistor layer comprising ZnO as a principal component.

* * * * *